US010818570B1

(12) United States Patent
England et al.

(10) Patent No.: US 10,818,570 B1
(45) Date of Patent: Oct. 27, 2020

(54) STACKED SEMICONDUCTOR DEVICES HAVING DISSIMILAR-SIZED DIES

(71) Applicant: GLOBALFOUNDRIES INC., Grand Cayman (KY)

(72) Inventors: Luke England, Saratoga Springs, NY (US); Daniel George Berger, New Paltz, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/413,613

(22) Filed: May 16, 2019

(51) Int. Cl.
*H01L 23/34* (2006.01)
*H01L 23/367* (2006.01)
*H01L 23/00* (2006.01)
*H01L 25/065* (2006.01)
*H01L 23/48* (2006.01)
*H01L 23/31* (2006.01)
*H01L 21/56* (2006.01)
*H01L 27/06* (2006.01)

(52) U.S. Cl.
CPC .......... *H01L 23/367* (2013.01); *H01L 21/565* (2013.01); *H01L 23/3121* (2013.01); *H01L 23/481* (2013.01); *H01L 24/09* (2013.01); *H01L 25/0652* (2013.01); *H01L 27/0688* (2013.01)

(58) Field of Classification Search
CPC . H01L 23/498; H01L 23/367; H01L 23/3121; H01L 23/481; H01L 25/0652
See application file for complete search history.

(56) References Cited

U.S. PATENT DOCUMENTS

| 8,242,543 | B2 | 8/2012 | Chandrasekaran et al. | |
| 2012/0049347 | A1* | 3/2012 | Wang | H01L 24/97 257/737 |
| 2012/0139076 | A1* | 6/2012 | Shankar | H01L 23/38 257/467 |
| 2012/0171814 | A1* | 7/2012 | Choi | H01L 23/3128 438/107 |
| 2017/0098628 | A1* | 4/2017 | Liu | H01L 21/568 |
| 2018/0012866 | A1* | 1/2018 | Choi | H01L 21/563 |
| 2018/0342635 | A1* | 11/2018 | Balasekaran | H01L 31/02240 |

* cited by examiner

*Primary Examiner* — Phuc T Dang
(74) *Attorney, Agent, or Firm* — David Cain

(57) ABSTRACT

A stacked semiconductor device is provided, which includes a first die, a second die and a heat dissipating layer. The first die has a pre-determined size. The second die is bonded to the first die using a dielectric material, wherein the second die is smaller than the first die. The heat dissipating layer is surrounding the second die, wherein the heat dissipating layer has an outer dimension that is equal to the size of the first die.

20 Claims, 6 Drawing Sheets

STACKED SEMICONDUCTOR DEVICES HAVING DISSIMILAR-SIZED DIES

FIELD OF THE INVENTION

The disclosed subject matter relates generally to stacked semiconductor devices, and more particularly to methods of manufacturing stacked semiconductor devices having dissimilar-sized dies and/or wafers and their resulting semiconductor devices.

BACKGROUND

A three-dimensional integrated circuit (3D IC) is an IC manufactured by stacking semiconductor wafers and/or dies and interconnecting them vertically using, for instance, through-substrate vias (TSVs) or copper pillars. The 3D IC behaves as a single device to achieve performance improvements with a smaller footprint, as compared to conventional two-dimensional semiconductor devices.

There are several stacking approaches to manufacture 3D ICs; for example, wafer-to-wafer, die-to-wafer, and die-to-die. In wafer-to-wafer stacking, wafers are stacked, bonded and packaged. Wafer-to-wafer stacking is typically the most straightforward and the most efficient process to manufacture 3D ICs; however, this approach normally requires wafers and dies of equal sizes.

When wafer-to-wafer stacking is not feasible, other less efficient approaches are employed, such as die-to-wafer and die-to-die stacking. In die-to-wafer stacking, dies are individually placed on a wafer, bonded and packaged. In die-to-die stacking, two dies are stacked, bonded and packaged. These stacking approaches have low throughput compared to wafer-to-wafer stacking. In addition, the dies need to be obtained through a wafer singulation process, and the wafer singulation process is a "dirty" process. Particle contamination from the wafer singulation process can weaken bonding at the stacking interfaces.

As described above, there is a need for efficient methods of manufacturing semiconductor devices having dissimilar-sized dies and/or wafers and their resulting semiconductor devices.

SUMMARY

To achieve the foregoing and other aspects of the present disclosure, methods of manufacturing stacked semiconductor devices having dissimilar-sized dies and/or wafers and their resulting semiconductor devices are presented.

According to an aspect of the disclosure, a stacked semiconductor device is provided, which includes a first die, a second die and a heat dissipating layer. The first die has a pre-determined size. The second die is bonded to the first die using a dielectric material, wherein the second die is smaller than the first die. The heat dissipating layer is surrounding the second die, wherein the heat dissipating layer has an outer dimension that is equal to the size of the first die.

According to another aspect of the disclosure, a stacked semiconductor device is provided, which includes a first die, a second die and a heat dissipating layer. The first die is at a bottom level and the second die is at a top level of the stacked semiconductor device. The first die has interconnect structures. The second die is electrically connected to the first die. The heat dissipating layer is surrounding the second die at the top level.

According to yet another aspect of the disclosure, a method of fabricating stacked semiconductor devices is provided. A first wafer having a plurality of window openings and window spacers being that portion of the first wafer between the window openings is provided. The first wafer is formed of a heat dissipating material. A first die is placed in each of the window openings. The first die is smaller than the window opening, leaving spaces between the first die and inner edges of the window opening. A mold compound is placed between the first dies and the inner edges of the window openings. A dielectric material is deposited over the first wafer and the first dies. A second wafer having a plurality of second dies is provided. The first wafer is aligned to the second wafer such that the first and second dies are also aligned. The first wafer and the second wafer are bonded using the dielectric material to form a wafer stack. The wafer stack is diced at the window spacers to form the stacked semiconductor devices and the window spacers form integrated heat dissipaters for the stacked semiconductor devices.

BRIEF DESCRIPTION OF THE DRAWINGS

The embodiments of the present disclosure will be better understood from a reading of the following detailed description, taken in conjunction with the accompanying drawings.

Figure 1:
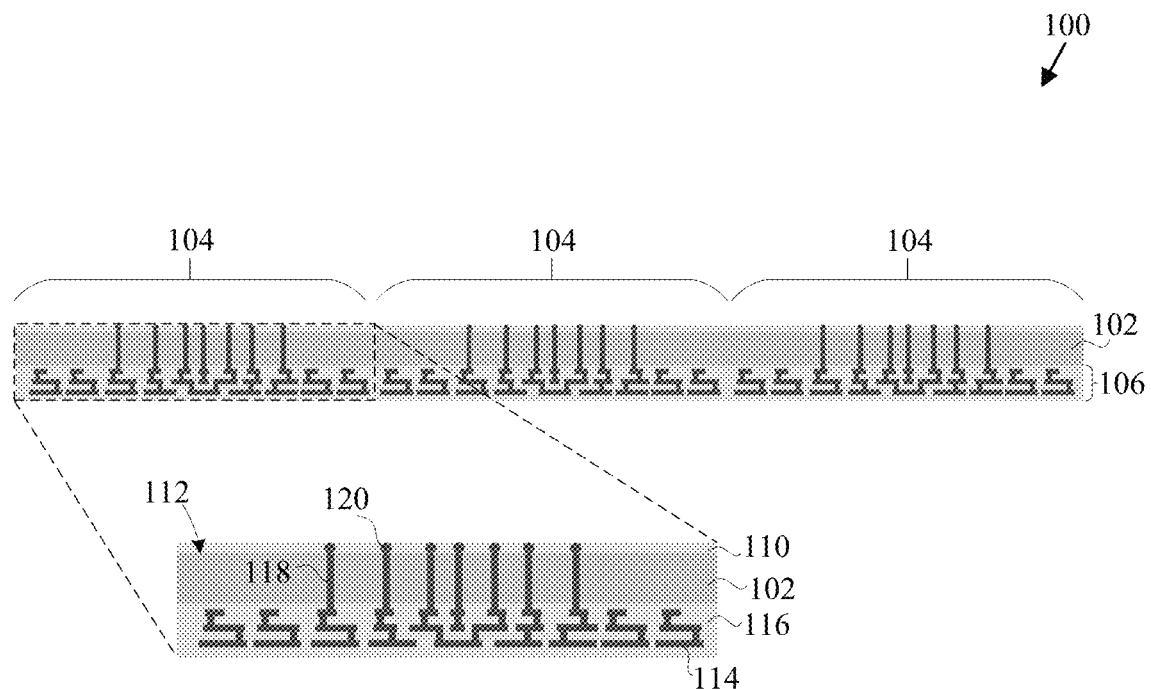
FIG. 1 is a cross-sectional view of a semiconductor wafer, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the disclosure. Additionally, elements in the drawings are not necessarily drawn to scale. For example, the dimensions of some of the elements in the drawings may be exaggerated relative to other elements to help improve understanding of embodiments of the disclosure. The same reference numerals in different drawings denote the same elements, while similar reference numerals may, but do not necessarily, denote similar elements.

DETAILED DESCRIPTION

Various embodiments of the disclosure are described below. The embodiments disclosed herein are exemplary and not intended to be exhaustive or limiting to the disclosure.

The disclosure relates generally to stacked semiconductor devices, and more particularly to methods of manufacturing stacked semiconductor devices having dissimilar-sized dies and/or wafers and their resulting semiconductor devices. As used herein, the term "stacked semiconductor devices" refers to semiconductor wafers and/or dies that are stacked on top of each other by wafer-to-wafer bonding, die-to-wafer bonding or die-to-die bonding.

The wafers described herein may be manufactured in a number of ways using a number of different tools, and are formed with dimensions per their intended design. Generally, methodologies and tools employed to manufacture the wafers have been adopted from known semiconductor technologies. For example, product wafers are manufactured by building IC structures (e.g., transistors, capacitors, interconnects, etc.) on a semiconductor substrate such as silicon.

Aspects of the disclosure are now described in detail with accompanying drawings. It is noted that like and corresponding elements are referred to by the use of the same reference numerals.

FIGS. 1-4 illustrate various elements for manufacturing a stacked semiconductor device. FIG. 1 is a cross-sectional view of a first wafer 100, according to an embodiment of the disclosure. The first wafer 100 includes a first semiconductor substrate 102, a plurality of first dies 104 each defined by a first active portion 106 on the first substrate 102 and a dielectric layer 110 on a substrate surface 112 opposite to the first active portion 106. The first active portion 106 includes a front-end-of-line (FEOL) portion and a back-end-of-line (BEOL) portion. The FEOL portion includes IC structures (e.g., transistors, capacitors, etc.), and is not shown for clarity. The BEOL portion includes interconnects 114 interposed in an interconnect dielectric layer 116. The first wafer 100 has through-substrate vias (TSVs) 118 and first hybrid bond pads 120, providing conductive pathways through the first substrate 102 of the first wafer 100 enabling electrical connection with external ICs. In one embodiment of the disclosure, the interconnect dielectric layer 116 is preferably formed of a predominantly inorganic dielectric material that includes silicon dioxide, silicon nitride, silicon carbonitride or silicon carboxynitride. As used herein, the term "predominantly inorganic" indicates that less than 50 weight percent of the dielectric material is carbon.

Figure 2:
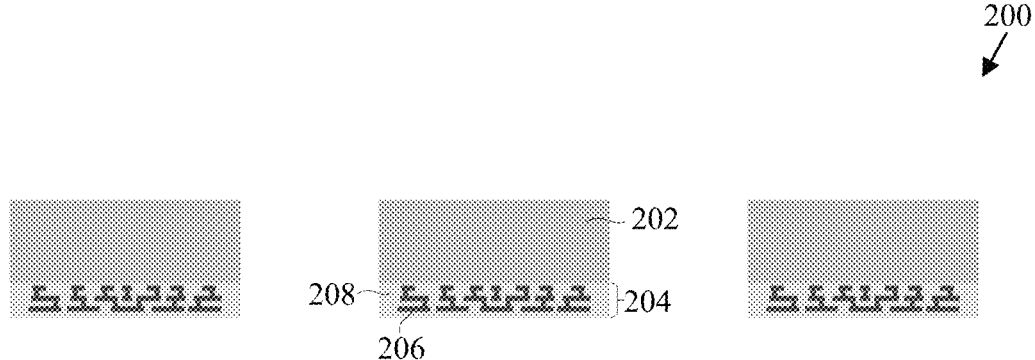
FIG. 2 is a cross-sectional view of a semiconductor die, according to an embodiment of the disclosure.

FIG. 2 is a cross-sectional view of a plurality of second dies 200 singulated from a second wafer after a wafer singulation process, according to an embodiment of the disclosure. Each of the second dies 200 includes a second semiconductor substrate 202 and a second active portion 204 over the second substrate 202. The second active portion 204 may include a front-end-of-line (FEOL) portion and a back-end-of-line (BEOL) portion. The FEOL portion includes IC structures (e.g., transistors, capacitors, etc.), and is not shown for clarity. The BEOL portion includes interconnects 206 interposed in an interconnect dielectric layer 208. Additionally, the second dies 200 at this stage have not been fabricated with a means to electrically connect with external ICs.

The second die 200 may be dissimilar in size relative to the first die 104 in FIG. 1. In one embodiment of the disclosure, the second die 200 is smaller than the first die 104.

In another embodiment of the disclosure, the interconnect dielectric layer 208 is preferably formed of a predominantly inorganic dielectric material that includes silicon dioxide, silicon nitride, silicon carbonitride or silicon carboxynitride, and is preferred to be the same dielectric material as the interconnect dielectric layer 116 of the first wafer 100. In yet another embodiment of the disclosure, the interconnects 206 of the second dies 200 are designed to align with the interconnects 114 of the first dies 104.

Figure 3:
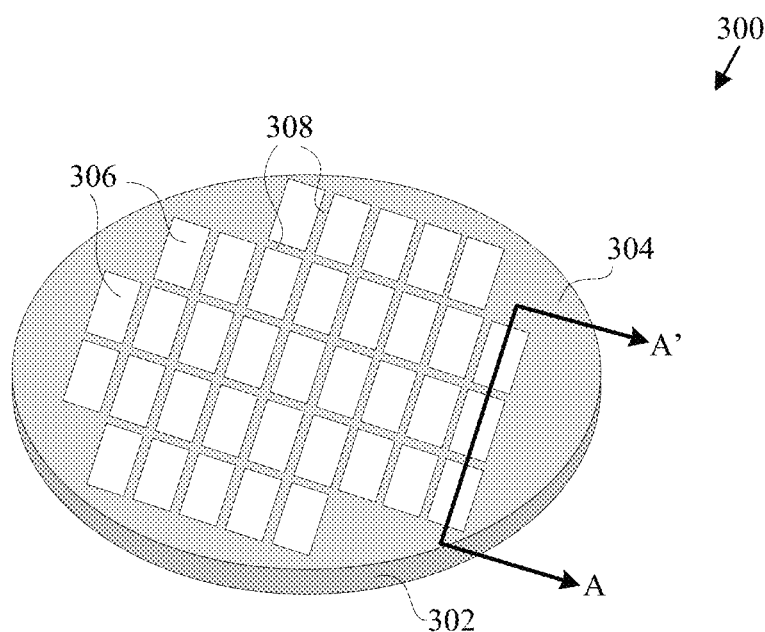
FIG. 3 is a perspective view of a semiconductor wafer, according to an embodiment of the disclosure.

FIG. 3 is a perspective view of a window wafer 300, according to an embodiment of the disclosure. The window wafer 300 includes a third semiconductor substrate 302, a dielectric layer 304 over the third substrate 302 and window openings 306 formed in the third substrate 302. The window openings 306 are defined by window spacers 308. The window openings 306 may be formed using known semiconductor processes. In one embodiment of the disclosure, the third semiconductor substrate 302 is preferably formed of a heat dissipating material.

The window wafer 300 may be a blanket wafer. As used herein, the term "blanket wafer" refers to a semiconductor wafer having one or more blanket films deposited over a semiconductor substrate. The blanket wafer does not contain any IC structures that may otherwise be present in a typical semiconductor product wafer.

In one embodiment of the disclosure, the window openings 306 are arranged in a layout that matches the first dies 104 of FIG. 1. In another embodiment of the disclosure, the window openings 306 may be adjusted to accommodate the largest die or the plurality of dies that will be ultimately placed in the window opening 306. In yet another embodiment of the disclosure, the window wafer 300 is preferably the same size as the first wafer 100. In a yet further embodiment of the disclosure, the dielectric layer 304 is preferably formed of a predominantly inorganic dielectric material that includes silicon dioxide, silicon nitride, silicon carbonitride or silicon carboxynitride and is preferred to be of the same dielectric material as the interconnect dielectric layer 208 of the second dies 200.

Figure 4:
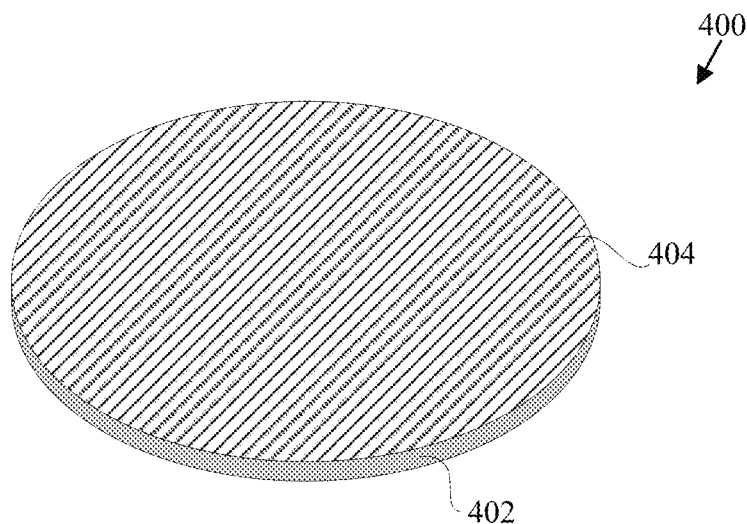
FIG. 4 is a perspective view of a semiconductor wafer, according to an embodiment of the disclosure.

FIG. 4 is a perspective view of a carrier wafer 400, according to an embodiment of the disclosure. The carrier wafer 400 includes a fourth semiconductor substrate 402 and an adhesive layer 404 deposited over the fourth substrate 402. The carrier wafer 400 provides a means for safe handling and/or processing of semiconductor wafers and/or dies and the adhesive layer 404 enables wafers and/or dies to be temporarily attached to the carrier wafer 400. The carrier wafer 400 may be a blanket wafer. In one embodiment of the disclosure, the carrier wafer 400 is preferably the same size as the window wafer 300. In another embodiment of the disclosure, the adhesive layer 404 may include low temperature waxes, hydrocarbon oligomers and polymers, or epoxy-modified films. The adhesive layer 404 may be deposited over the fourth substrate 402 by a spin-coating process.

The semiconductor substrates of FIGS. 1-4 above may include of any appropriate semiconductor material, such as silicon, silicon germanium, silicon carbon, other II-VI or III-V semiconductor compounds and the like. In one embodiment of the disclosure, the semiconductor material of the substrates of FIGS. 1-4 is preferably silicon. In particular, the third semiconductor substrate 302 of the window wafer 300 is preferably silicon.

FIGS. 5A-5H are cross-sectional views of a semiconductor device 500 (taken along a line A-A' as indicated in FIG. 3), illustrating successive stages of manufacturing stacked semiconductor devices having dissimilar-sized dies, according to an embodiment of the disclosure.

Figure 5A:
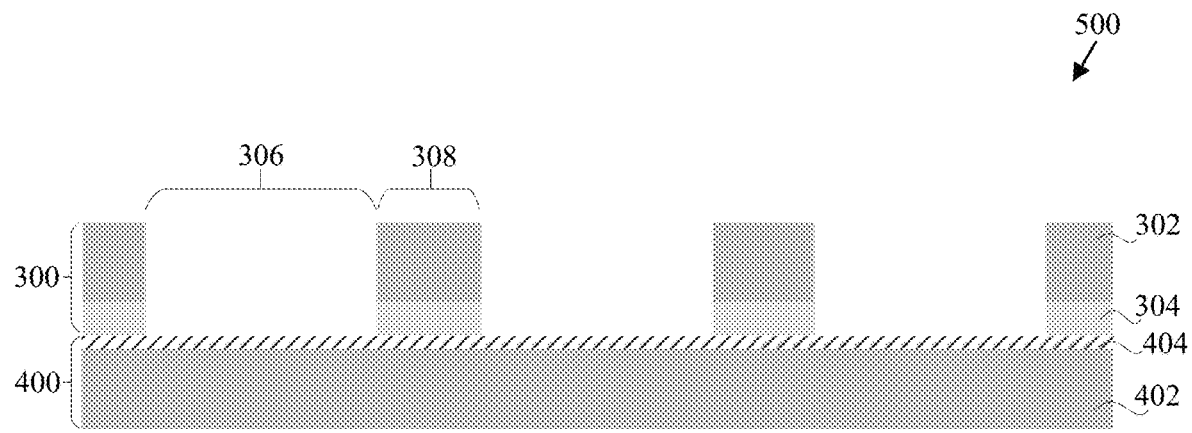
FIGS. 5A-5H are cross-sectional views depicting successive stages of manufacturing stacked semiconductor devices having dissimilar dies, according to an embodiment of the disclosure.

Referring to FIG. 5A, the window wafer 300 is placed on the carrier wafer 400, such that the dielectric layer 304 of the window wafer 300 is in contact with the adhesive layer 404 of the carrier wafer 400. A portion of the adhesive layer 404 is exposed in the window openings 306 of the window wafer 300.

Figure 5B:
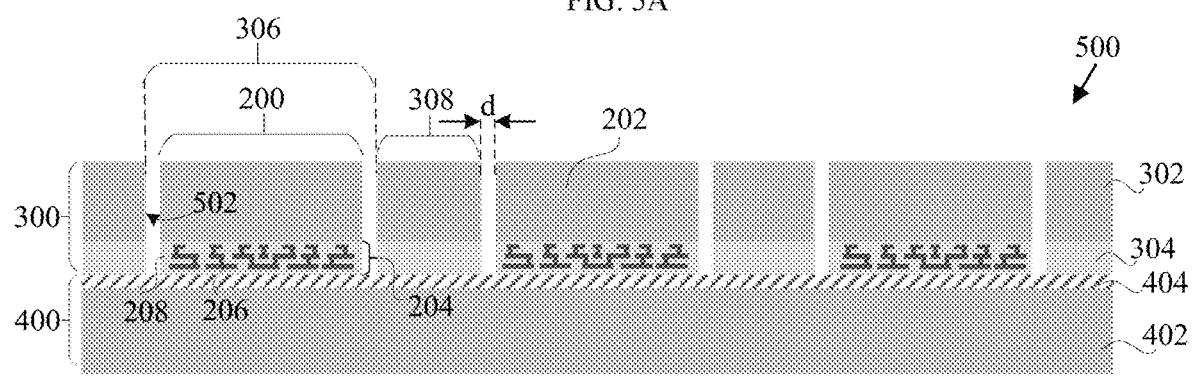

FIG. 5B illustrates the semiconductor device 500 after stacking the second dies 200 over the carrier wafer 400. The second dies 200 are positioned in the window openings 306 of the window wafer 300. The second dies 200 are placed such that the second active portion 204 is in contact with the adhesive layer 404. Placement of the second dies 200 may be carefully controlled by having alignment marks fabricated on the window spacers 308. Even though the second dies 200 and the window wafer 300 are illustrated to have a same thickness in FIG. 5B, the second dies 200 and the window wafer 300 may or may not have the same thickness. As the second dies 200 are smaller than the window openings 306, it is expected to leave a space d between the second die 200 and an inner edge 502 of the window opening 306. In one embodiment of the disclosure, the gap d is at least 50 um.

Figure 5C:
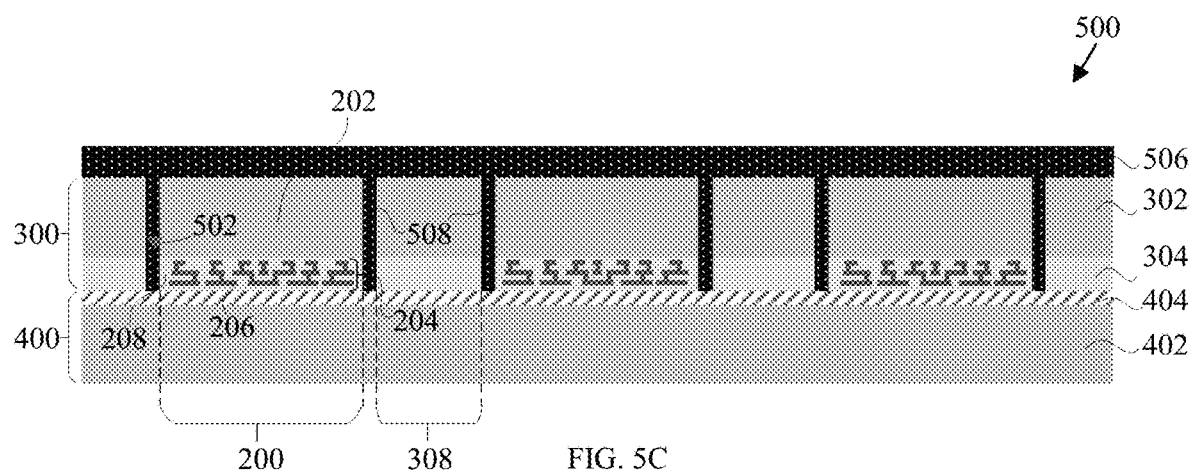

FIG. 5C illustrates the semiconductor device 500 after a suitable wafer level molding process. A mold compound 506 is deposited over the second dies 200 and the window wafer 300, filling the space d between the second dies 200 and the inner edges 502 of the window openings 306 to form mold compound spacers 508. In one embodiment of the disclosure, the mold compound 506 includes a polymer-based material.

Figure 5D:
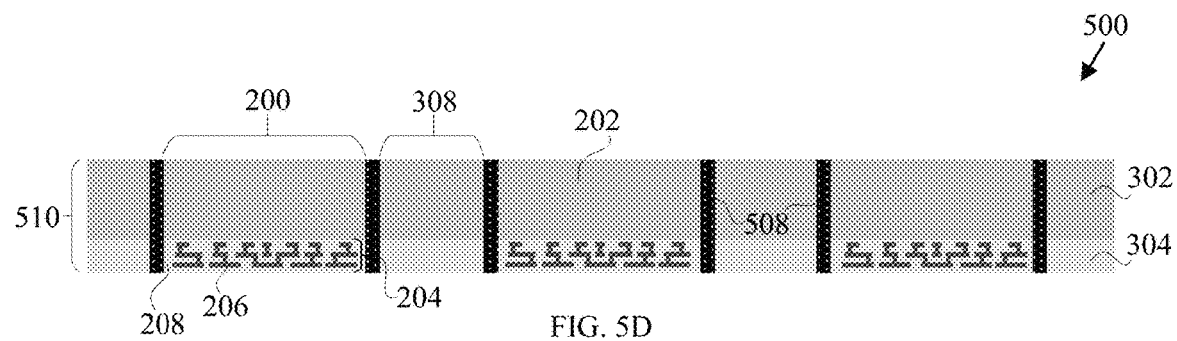

FIG. 5D illustrates the semiconductor device 500 after forming a reconstructed wafer 510 through a plurality of processes. The carrier wafer 400 is removed from the semiconductor device 500 using a suitable de-bonding process. The mold compound 506 over the second dies 200 and the window wafer 300 is removed using a suitable removal process, such as mechanical backgrinding process, to form the reconstructed wafer 510. A portion of the second substrate 202 of the second dies 200 and third substrate 302 of the window wafer 300 may also be planarized in the process, resulting in both the second dies 200 and the window wafer 300 having a same thickness. In one embodiment of the disclosure, the removal process may be performed after the de-bonding process. In another embodiment of the disclosure, the reconstructed wafer 510 has a thickness of approximately 750 um after the removal process.

Advantageously, by bonding the second dies 200 with the window wafer 300 together using the mold compound spacers 508 to form the reconstructed wafer 510, the reconstructed wafer 510 may now be easily cleaned using established wafer cleaning processes, for instance a wet clean process, to remove potential particle contamination from the wafer singulation process used to obtain the second dies 200. The reconstructed wafer 510 also enables the manufacturing of the stacked semiconductor device using the wafer-to-wafer stacking approach that is efficient and straightforward.

Figure 5E:
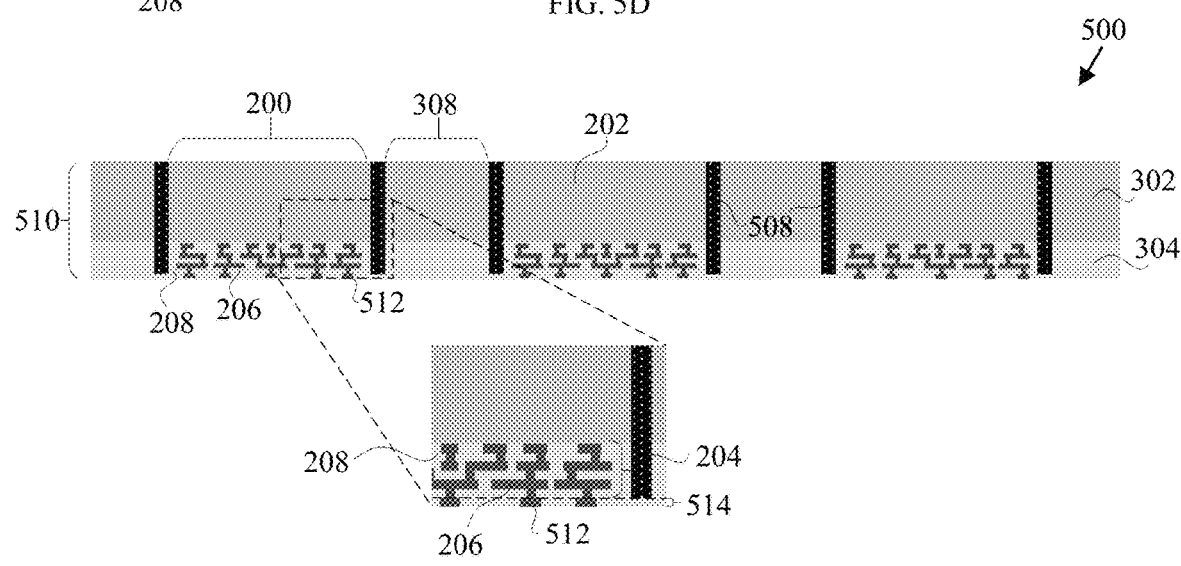

FIG. 5E illustrates the semiconductor device 500 after forming second hybrid bond pads 512 over the second active portions 204 of the second dies 200. A dielectric layer 514, demarcated by a dashed line, is deposited over the exposed second active portions 204 of the second dies 200 to form the second hybrid bond pads 512 and its corresponding interconnect vias using a conventional dual-damascene process. The dielectric layer 514 is deposited using a suitable deposition process, such as a low temperature chemical vapor deposition (CVD) process. The second hybrid bond pads 512 provide a means to electrically connect the second dies 200 to external ICs. In one embodiment of the disclosure, the dielectric layer 514 is preferred to be the same dielectric material as the interconnect dielectric layer 208 to form a strong dielectric bonding between them. In another embodiment of the disclosure, the dielectric layer 514 is preferably formed of a predominantly inorganic dielectric material that includes silicon dioxide, silicon nitride, silicon carbonitride or silicon carboxynitride. In yet another embodiment of the disclosure, the dielectric layer 514 is preferred to be the same dielectric material as the dielectric layer 110 of the first wafer 100.

Figure 5F:
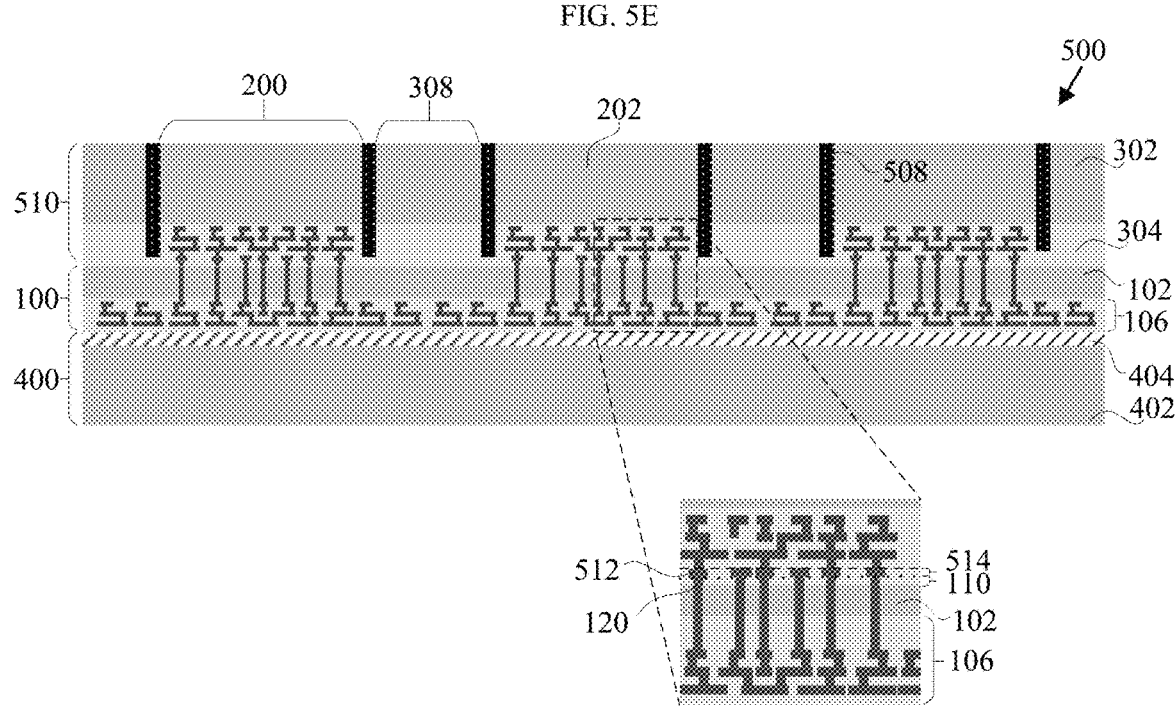

FIG. 5F illustrates the semiconductor device 500 after stacking the reconstructed wafer 510 over the first wafer 100. The first wafer 100 is stacked over the carrier wafer 400, such that the first active portion 106 of the first wafer 100 is in contact with the adhesive layer 404 of the carrier wafer 400. The carrier wafer 400 provides structural strength to the first wafer 100 for processing. The reconstructed wafer 510 is then stacked over the first wafer 100, with the first wafer 100 at a first level and the reconstructed wafer 510 at a second level of the semiconductor device 500, and a stacking interface is demarcated by a dotted line. The dielectric layer 514 of the reconstructed wafer 510 is in contact with the dielectric layer 110 of the first wafer 100. The second hybrid bond pads 512 of the reconstructed wafer 510 may align with the first hybrid bond pads 120 of the first wafer 100 to enable electrical connection between the first wafer 100 and the reconstructed wafer 510. A thermal anneal process may be performed to fuse the second hybrid bond pads 512 of the reconstructed wafer 510 to the first hybrid bond pads 120 of the first wafer 100. The window spacers 308 of the window wafer 300 are electrically isolated from the first wafer 100 and from the second dies 200.

Advantageously, by forming the second hybrid bond pads 512 of the second dies 200 after the reconstructing into the reconstructed wafer 510, the dielectric layer 514 deposited during the formation of the second hybrid bond pads 512 will be deposited over the mold compound spacers 508 to form a single dielectric material over the reconstructed wafer 510. As a result, due to the material compatibility of the dielectric layer 514 of the reconstructed wafer 510 and the dielectric layer 110 of the first wafer 100, strong bonding at the stacking interface between the reconstructed wafer 510 and the first wafer 100 may be achieved through a hybrid wafer bonding process.

The hybrid wafer bonding process is well known to those skilled in the art and an exemplary process is described below. The dielectric layer 514 including the bond pads 512, and the dielectric layer 110 including the first hybrid bond pads 120, are planarized and polished using a suitable process to achieve a surface roughness of approximately 1 nm RMS or lower. The dielectric layers (110 and 514, respectively) are subsequently activated with a plasma and using a suitable material removing process, such as wet clean process, dangling bonds, such as hydroxyl bonds (—OH), are formed on the dielectric layers (110 and 514, respectively). When the reconstructed wafer 510 is stacked over the first wafer 100, the dielectric layer 110 of the first wafer 100 comes into contact with the dielectric layer 514 of the reconstructed wafer 510, their respective dangling hydroxyl bonds become chemically bonded together. The reconstructed wafer 510 and the first wafer 100 are bonded together by the dielectric layer 514 and the dielectric layer 110, respectively. A post-bond thermal anneal may be performed to drive a wafer-to-wafer interconnect formation through diffusion of the first and second hybrid bond pads (120 and 512, respectively).

Figure 5G:
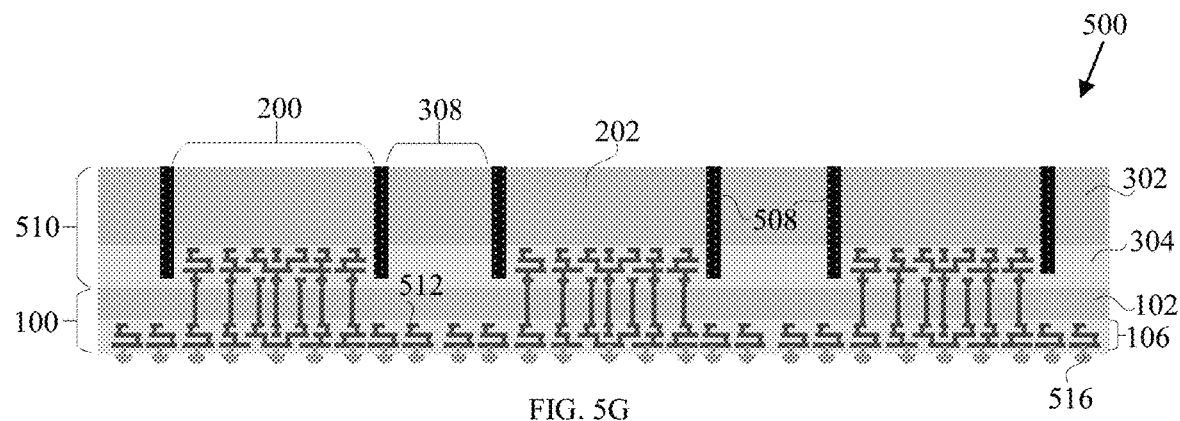

FIG. 5G illustrates the semiconductor device 500 after a suitable wafer bumping process. The carrier wafer 400 is removed from the first wafer 100 using a suitable de-bonding process, exposing the first active portions 106 of the first wafer 100. Additional film layer/s may be deposited along with an interconnect structure 516, such as solder bumps or copper pillars, over the first active portions 106 of the first wafer 100 to enable electrical connections with external ICs.

Figure 5H:
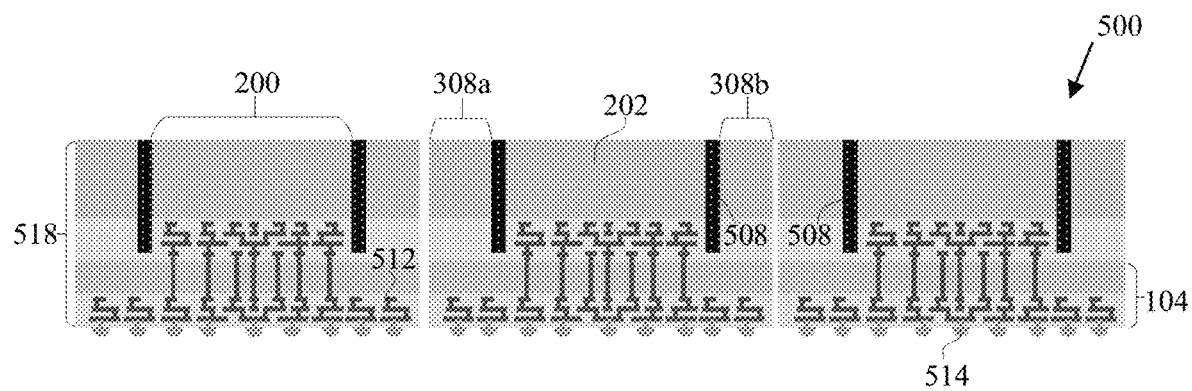

FIG. 5H illustrates the semiconductor device 500 after a suitable wafer singulation process. Stacked semiconductor dies 518 are formed by dicing or singulating the semiconductor device 500 through the window spacers 308 of the window wafer 300. The stacked semiconductor die 518 has portions of the window spacers 308*a* and 308*b* surrounding the mold compound spacers 508 and the second die 200 at the second level of the stacked semiconductor die 518. Even though the portions of the window spacers 308*a* and 308*b* are illustrated to have the same width, it is within the scope of the present disclosure to have the widths of the window spacers 308*a* and 308*b* have different widths.

Advantageously, as the portions of the window spacers 308*a* and 308*b* are formed from the third semiconductor substrate 302 which is preferably formed of a heat dissipating material, the window spacers 308*a* and 308*b* are able to function as an integrated heat dissipater to dissipate heat from the stacked semiconductor die 518. The portions of the window spacers 308*a* and 308*b* extend to edges of the stacked semiconductor die 518 to effectively remove heat even from those IC structures at the edges of the stacked semiconductor die 518. The portions of the window spacers 308*a* and 308*b* are also electrically isolated from the second die 200 and the first die 104.

Additionally, employing the use of the window wafer 300 as part of the manufacturing of the stacked semiconductor die 518 eliminates a need to maintain an inventory of dummy dies that may be necessary for assembling with a second die to match the size of a first die.

Figure 6:
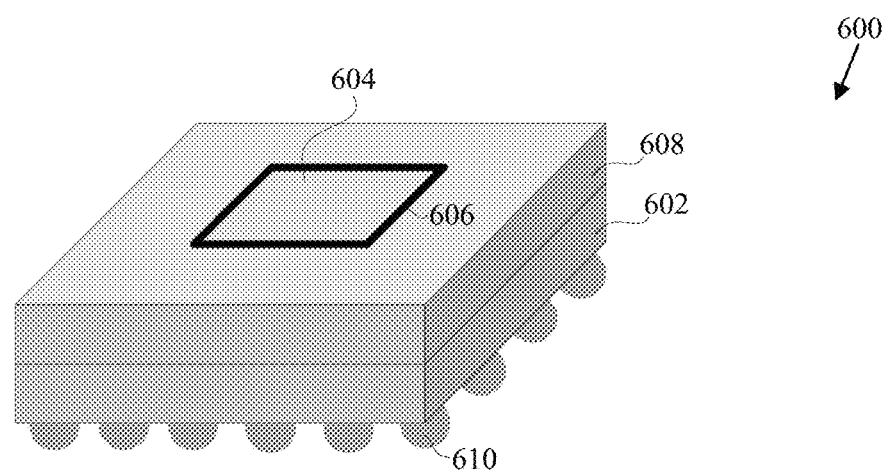
FIG. 6 is a perspective view of a stacked semiconductor device having two levels, according to an embodiment of the disclosure.

FIG. 6 illustrates a perspective view of a stacked semiconductor device 600 having two levels, according to an embodiment of the disclosure. A first die 602 is at a first level. A second die 604, a mold compound spacer 606 surrounding the second die 604 and an integrated heat dissipater 608 surrounding the mold compound spacer 606 are at a second level above the first die 602. The integrated heat dissipater 608 has a same outer dimension as the first die 602. The first die 602 has TSV (not shown) fabricated to electrically connect to the second die 604. The first die 602 has an interconnect structure 610, such as solder bumps or copper pillars, to enable electrical connections with external ICs. Although FIG. 6 shows the stacked semiconductor device 600 having a square shape, it will be appreciated by those skilled in the art that the shape of the stacked semiconductor device may vary according to the specific shape of the first die 602.

In one embodiment of the disclosure, the second die 604 is dissimilar in size relative to the first die 602. In another embodiment of the disclosure, the second die 604 has a smaller size than the first die 602. In yet another embodiment of the disclosure, the mold compound spacer 606 has a width of at least 50 um.

Figure 7:
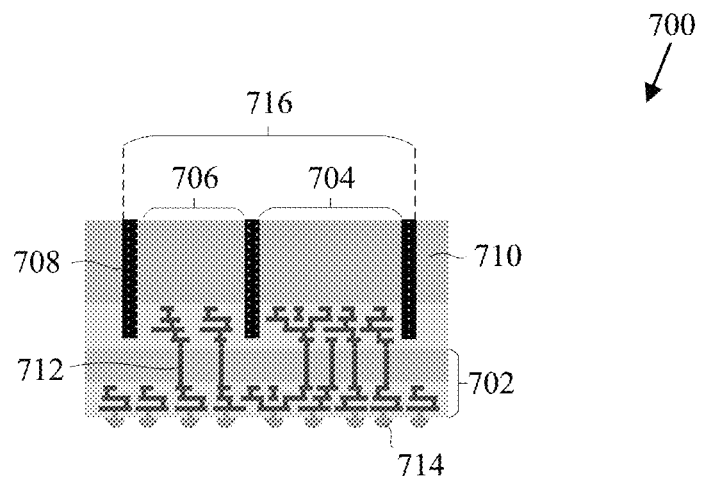
FIG. 7 is a cross-sectional view of a two-level stacked semiconductor device having two dissimilar-sized dies at a top level, according to an embodiment of the disclosure.

FIG. 7 illustrates a cross-sectional view of a stacked semiconductor device 700 having two levels, according to an embodiment of the disclosure. A first die 702 is at a first level. A second die 704 and a third die 706 are at a second level, above the first die 702. The second die 704 and the third die 706 have a smaller size than the first die 702. The second die 704 and the third die 706 were positioned in a window opening 716 in a window wafer (not shown), the second die 704 and the third die 706 having a smaller size than the window opening 716. The first die 702 has TSV 712 fabricated to electrically connect to the second die 704 and the third die 706.

In accordance with the present disclosure, although not shown, a mold compound was deposited over a window wafer, filling spaces between the second die 704, the third die 706 and the window wafer, and forms mold compound spacers 708. The mold compound spacers 708 surround the second die 704 and the third die 706. An integrated heat dissipater 710, formed from window spacers defining window openings 716 in the window wafer, surrounds the mold compound spacers 708 at the second level. The integrated heat dissipater 710 has a same outer dimension as the first die 702. The first die 702 has an interconnect structure 714, such as solder bumps or copper pillars, to enable electrical connections with external ICs. In one embodiment of the disclosure, the second die 704 and the third die 706 are dissimilar in size relative to the first die 702.

Figure 8:
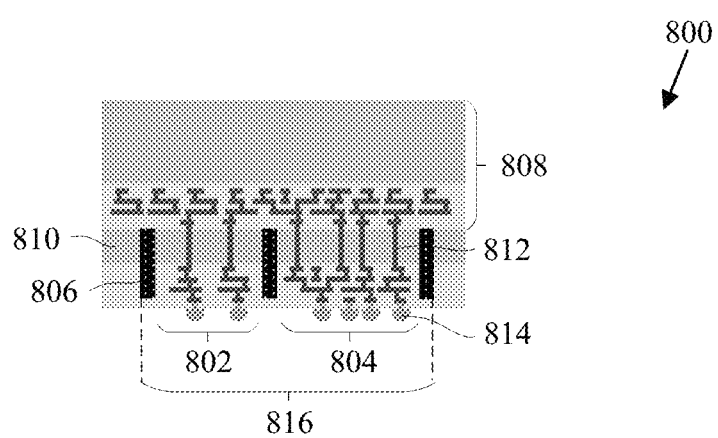
FIG. 8 is a cross-sectional view of a two-level stacked semiconductor device having two dissimilar-sized dies at a bottom level, according to an embodiment of the disclosure.

FIG. 8 illustrates a cross-sectional view of a stacked semiconductor device 800 having two levels, according to an embodiment of the disclosure. A first die 802 and a second die 804 at a first level and a third die 808 is positioned at a second level.

In accordance with the present disclosure, although not shown, the first die 802 and the second die 804 were positioned in a window opening 816 in a window wafer and a mold compound is deposited over the window wafer. The mold compound fills spaces between the first die 802, the second die 804 and the window wafer, and forms mold compound spacers 806. The mold compound spacers 806 surround the first die 802 and the second die 804.

The third die 808 has a larger size than the first die 802 and the second die 804. The first die 802 and the second die 804 have TSV 812 fabricated to electrically connect to the third die 908. An integrated heat dissipater 810, formed from window spacers defining the window openings in the window wafer, surrounds the mold compound spacer 806 at the first level. The integrated heat dissipater 810 has a same outer dimension as the third die 808. The first die 802 and the second die 804 have an interconnect structure 814, such as solder bumps or copper pillars, to enable electrical connections with external ICs. In one embodiment of the disclosure, the first die 802 and the third die 808 are dissimilar in size relative to each other.

Figure 9:
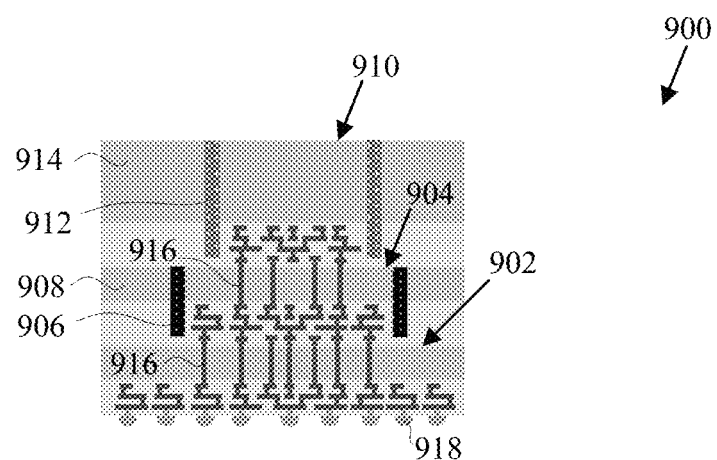
FIG. 9 is a cross-sectional view of a stacked semiconductor device having three levels, according to an embodiment of the disclosure.

FIG. 9 illustrates a cross-sectional view of a stacked semiconductor device 900 having three levels, according to an embodiment of the disclosure. A first die 902 is at a first level, a second die 904 at a second level, and a third die 910 at a third level. The first die 902 has an interconnect structure 918, such as solder bumps or copper pillars, to enable electrical connections with external ICs. The first die 902 and the second die 904 have TSV 916 fabricated to electrically connect to the dies above them. The second die 904 and third die 910 may be placed in window wafers and undergo similar processing steps of being surrounded by a mold compound, in accordance with the present disclosure.

The second die 904, a first mold compound spacer 906 and a first integrated heat dissipater 908, surrounding the first mold compound spacer 906 and the second die 904, are positioned at the second level above the first die 902. The second die 904 is aligned to the first die 902. The first integrated heat dissipater 908 has a same outer dimension as the first die 902.

The third die 910, a second mold compound spacer 912 and a second integrated heat dissipater 914, surrounding the second mold compound spacer and the third die, are positioned at the third level above the second die 904. The second integrated heat dissipater 914 also has a same outer dimension as the first die 902.

In one embodiment of the disclosure, the first die 902, the second die 904 and the third die 910 are dissimilar in size relative to each other. In another embodiment of the disclosure, the second die 904 and third die 910 may have a smaller size than the first die 904. In yet another embodiment, the second die 904 may have a smaller size than the first die 904 and the third die 910 may have the same size as the first die, without an integrated heat dissipater.

It is to be understood that the specific arrangements of the stacked semiconductor devices described above are used for illustration purposes only, and that a variety of possible arrangements or layouts may benefit from embodiments of the disclosure described herein.

There are several advantages in fabricating a reconstructed wafer to be used in manufacturing a stacked semiconductor device. The reconstructed wafer enables the use of a wafer-to-wafer stacking approach that is efficient and straightforward. Furthermore, wafers (product wafers and/or reconstructed wafers) to be used in manufacturing a stacked semiconductor device may be fabricated in parallel, may be fabricated in different locations and/or on different tools or fabrication lines. Wafer sizes from which the dies are obtained does not affect the manufacturing of the reconstructed wafer as the dies are singulated before reconstructing into a wafer form. Additionally, the dies may be singulated from multiple wafers. As the dies are individually picked and placed to form the reconstructed wafers, specific test bins may be combined for optimum stack performance. The dies may also be of different sizes singulated from different wafers, possibly of different sizes.

Using reconstructed wafers may also improve the yield of the stacked semiconductor devices. For instance, dies may be tested to identify functional and non-functional dies before singulating and reconstructing into a wafer form. In one embodiment of the disclosure, only functional dies are integrated into the reconstructed wafer. Non-functional dies may be discarded, saving time and processing time to fabricate a non-functional stacked semiconductor device. In another embodiment of the disclosure, functional and non-functional dies are integrated into the reconstructed wafer. The functional dies will be placed in window openings to be stacked with corresponding functional dies, and the non-functional dies will be placed in window openings to be stacked with corresponding non-functioning dies. In this instance, when the reconstructed wafer and a wafer stacked together, the non-functional dies in the reconstructed wafer and the non-functional dies in the wafer are aligned with each other and may be discarded after a singulation process. The flexibility to select functional and/or non-functional dies is advantageous, especially for multi-level stacked semiconductor devices. The multi-level stacked semiconductor device is non-functional if there is a non-functional die in any of the levels.

In the above detailed description, methods of manufacturing stacked semiconductor devices having dissimilar-sized dies and/or wafers and their resulting semiconductor devices are presented. Fabricating a reconstructed wafer using a window wafer and placing singulated dies in the window wafer enables an efficient wafer-to-wafer stacking approach to manufacture stacked semiconductor devices. The window wafer and the singulated dies are molded together using a mold compound. The reconstructed wafer is stacked over a wafer using a wafer-to-wafer stacking approach to form a semiconductor wafer stack. The wafer is at a first level of the semiconductor wafer stack and has dissimilar-sized dies relative to the singulated dies. The reconstructed wafer is at a second level of the semiconductor wafer stack. The semiconductor wafer stack is singulated through the window wafer to form stacked semiconductor devices. A portion of the window wafer surrounds the singulated dies and extends to edges of the stacked semiconductor devices. This portion of the window wafer functions as an integrated heat dissipater to dissipate heat from the stacked semiconductor device during operation.

Additionally, the wafer-to-wafer stacking approaches may include wafers manufactured at different locations with different technologies and processes. The wafer sizes of the dies at the second and/or higher level of the stacked semiconductor device do not affect the manufacturing of the stacked semiconductor device. The dies at the second and/or higher level of the stacked semiconductor devices may have different sizes singulated from different wafers of possibly different sizes. The yield of the stacked semiconductor device may be improved by selecting functional and/or non-functional dies and stacking the corresponding functional or non-functional over them.

The terms "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in one embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:
1. A stacked semiconductor device comprising:
  a first die having a pre-determined size;

a second die bonded to the first die, wherein the second die is smaller than the first die; and a semiconductor material surrounding the second die, wherein the semiconductor material has an outer dimension that is equal to the size of the first die and having a top surface substantially coplanar with a top surface of the second die.

2. The stacked semiconductor device of claim 1 further comprises a mold compound between the second die and the semiconductor material.

3. The stacked semiconductor device of claim 2 wherein the mold compound has a width of at least 50 um.

4. The stacked semiconductor device of claim 1, wherein the second die further comprises a through-substrate via and a second hybrid bond pad to electrically connect to a third die, wherein the second hybrid bond pad is formed through a dielectric material of the second die.

5. The stacked semiconductor device of claim 4 further comprises:
the third die being smaller than the first die;
the semiconductor material being a first semiconductor material; and
a second semiconductor material surrounding the third die, wherein the second semiconductor material has an outer dimension that is equal to the size of the first die.

6. The stacked semiconductor device of claim 1 further comprises:
a third die electrically connected to the first die, the third die is placed adjacent to the second die; and
the semiconductor material surrounding the second die additionally surrounds the third die.

7. The stacked semiconductor device of claim 1, wherein the first die further comprises a first dielectric layer and the second die further comprises a second dielectric layer, wherein the first and second dies are at least partially bonded by dielectric bonding of the first and second dielectric layers.

8. The stacked semiconductor device of claim 7, wherein the first die and the second die are electrically connected through a through-substrate via and a first hybrid bond pad that is formed through the first dielectric layer of the first die.

9. The stacked semiconductor device of claim 7, wherein the first and second dielectric layers of the first and second dies have an outer dimension that is equal to the size of the first die.

10. A stacked semiconductor device comprising:
a first die at a bottom level, the first die having interconnect structures;
a second die at a top level electrically connected to the first die; and
a semiconductor material surrounding the second die at the top level, the semiconductor material having a top surface substantially coplanar with a top surface of the second die.

11. The stacked semiconductor device of claim 10 wherein the semiconductor material has an inner dimension that is at least 100 um larger than the second die and is electrically isolated from the first die and the second die.

12. The stacked semiconductor device of claim 10 wherein the second die is smaller than the first die.

13. The stacked semiconductor device of claim 10 wherein the semiconductor material has an outer dimension that is equal to an outer dimension of the first die.

14. The stacked semiconductor device of claim 10 wherein the first die and the second die are electrically connected using a through-substrate-via and a hybrid bond pad that is formed through a dielectric material of the first die.

15. A method of fabricating stacked semiconductor devices comprising:
providing a first wafer having a plurality of window openings and window spacers being that portion of the first wafer between the window openings, wherein the first wafer is made of a semiconductor material;
placing a first die in each of the window openings, wherein the first die is smaller than the window opening, leaving spaces between the first die and inner edges of the window opening;
placing a mold compound in the spaces between the first dies and the inner edges of the window openings;
depositing a dielectric material on the first wafer and the first dies;
providing a second wafer having a plurality of second dies;
aligning the first wafer to the second wafer, wherein the first and second dies are also aligned;
bonding the first and second wafers using the dielectric material to form a wafer stack; and
dicing the wafer stack at the window spacers to form the stacked semiconductor devices, wherein the window spacers have a top surface substantially coplanar with a top surface of the first die.

16. The method of claim 15, wherein placing the mold compound in the spaces between the first die and the inner edges of the window openings further comprising:
depositing a layer of the mold compound covering the first wafer and the first dies during filling the spaces; and
removing the layer of mold compound covering the first wafer and the first dies, leaving the mold compound in the spaces between the first dies and the inner edges of the window openings.

17. The method of claim 16, wherein removing the layer of the mold compound covering the first wafer and the first dies planarizes and levels the first wafer and the first dies.

18. The method of claim 15 further comprises:
forming first hybrid bond pads on the first dies; and
forming second hybrid bond pads on the second dies, wherein aligning the first dies and the second dies also contact the first hybrid bond pads to the second hybrid bond pads to enable electrical connections between them.

19. The method of claim 18 wherein the first hybrid bond pads are formed in the dielectric material.

20. The method of claim 15 further comprises:
providing a third wafer having a plurality of third dies surrounded by a mold compound; and
aligning and electrically bonding the third wafer with the wafer stack before dicing the wafer stack.

* * * * *